United States Patent
Iwase

(10) Patent No.: US 6,704,922 B2
(45) Date of Patent: Mar. 9, 2004

(54) CORRECTING METHOD OF MASK AND MASK MANUFACTURED BY SAID METHOD

(75) Inventor: Taira Iwase, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 10/045,193

(22) Filed: Oct. 18, 2001

(65) Prior Publication Data

US 2002/0069398 A1 Jun. 6, 2002

(30) Foreign Application Priority Data

Dec. 1, 2000 (JP) ........................................ 2000-367357

(51) Int. Cl.[7] .............................................. G06F 17/50
(52) U.S. Cl. ............................. 716/20; 716/19; 714/773
(58) Field of Search ................... 716/20, 21, 19; 714/773

(56) References Cited

FOREIGN PATENT DOCUMENTS

| JP | 09-223751 | * | 8/1997 | ....... H01L/21/8246 |
| JP | 2000-214571 | * | 8/2000 | ......... H01L/21/027 |

* cited by examiner

*Primary Examiner*—Vuthe Siek
*Assistant Examiner*—Sun James Lin
(74) *Attorney, Agent, or Firm*—Hogan & Hartson, LLP

(57) ABSTRACT

According to a first aspect of the present invention, there is provided a method of correcting a mask for a data program of a read only memory, comprising selecting an optional data from a data map comprising first data and second data, the optional data being one of the first data, and inspecting neighboring data around the optional data and, where all the neighboring data surrounding the optional data are the second data, correcting a shape of the mask in a position corresponding to the optional data.

16 Claims, 5 Drawing Sheets

CORRECTING METHOD OF MASK AND MASK MANUFACTURED BY SAID METHOD

CROSS-REFERENCE TO RELATED APPLICATIONS

This application is based upon and claims the benefit of priority from the prior Japanese Patent Application No. 2000-367357, filed Dec. 1, 2000, the entire contents of which are incorporated herein by reference.

BACKGROUND OF THE INVENTION

1. Field of the Invention

The present invention relates to a method of correcting a mask used in a data program of a read only memory and a mask manufactured by the particular method.

2. Description of the Related Art

In recent years, a mask ROM (Read Only Memory) of a large capacity is used in accordance with an increase in demands for a stationary data memory. Also, a fine process technology is employed in accordance with an increase in the capacity of the mask ROM.

A mask in which the ROM data are patterned, hereinafter referred to as "ROM mask", is used in the data program of the mask ROM. Patterns are arranged to conform with the ROM data in the ROM mask. The pattern is generally shaped square or oblong.

In the conventional technology described above, the problem described below is generated with reduction in the design rule. To be more specific, it was possible for the size of the resist in the PEP (Photo Engraving process) step to fail to form the optimum value depending on combination of the ROM data. The difficulty is generally considered to be caused by the optical proximity effect.

In order to avoid the problem noted above, and OPC (Optical Proximity Correction) technology is employed in the general mask. The OPC technology noted above represents a technology for performing the optimum correction by computer processing.

However, in the computer processing by the OPC technology, correction is applied to the figure data of the ROM mask, giving rise to the problem that a considerably long time is required for the correction. Therefore, in the mask ROM requiring a short delivery time, the ROM mask is required to be manufactured in a short time, with the result that it was impossible to make corrections by computer processing as in the general mask.

As described above, in the prior art, it was difficult to make the optimum correction in the ROM mask in a short time.

BRIEF SUMMARY OF THE INVENTION

According to a first aspect of the present invention, there is provided a method of correcting a mask for a data program of a read only memory, comprising: selecting an optional data from a data map comprising first data and second data, the optional data being one of the first data; and inspecting neighboring data around the optional data and, where all the neighboring data surrounding the optional data are the second data, correcting a shape of the mask in a position corresponding to the optional data.

According to a second aspect of the present invention, there is provided a mask for a data program of a read only memory, comprising holes formed in positions corresponding to first data of a data map comprising the first data and second data, the holes including a hole of first shape and a hole of second shape, the hole of first shape corresponding to the first data surrounded by the second data from within the first data, the hole of second shape corresponding to the first data be adjacent to the first data from within the first data.

DETAILED DESCRIPTION OF THE INVENTION

A mask for a data program in which the ROM (Read Only Memory) data "1" and "0" are patterned, hereinafter referred to as "ROM mask", is used in the mask ROM for the read only memory. In general, square or oblong holes are formed in the ROM mask corresponding to the ROM data "1".

In embodiments of the present invention, the data correction is performed on a ROM data map in the computer processing for preparing a mask for the read only mask. The embodiments of the present invention will now be described with reference to the accompanying drawings.

[First Embodiment]

In the ROM mask, where another hole is not present around an optional hole, the optional hole is put in an insulated state and is diminished, with the result that an ion implantation cannot be applied sufficiently to the hole of the insulated state. Therefore, in the first embodiment, a positive correction is applied to the hole for the insulated "1" data on the ROM data map.

Figure 1:
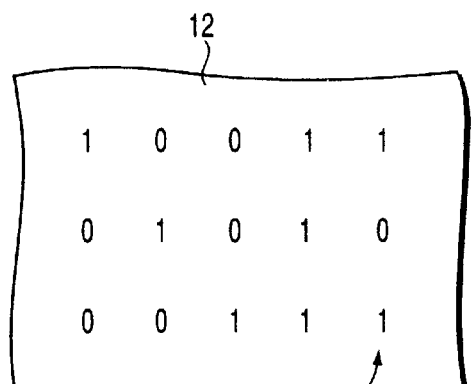
FIG. 1 shows a ROM data map according to a first embodiment of the present invention.
Figure 2:
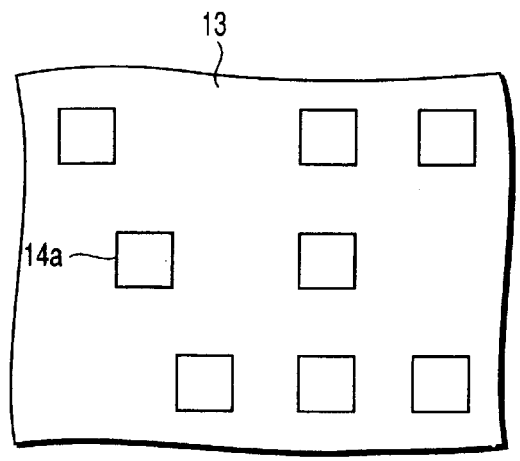
FIG. 2 shows a ROM mask before correction according to the first embodiment of the present invention.

FIG. 1 shows the ROM data map according to the first embodiment present invention, and FIG. 2 shows the ROM mask before correction according to the first embodiment of the present invention.

In the first embodiment, used is a ROM data map 12 in which ROM data 11 of "1" and "0" are irregularly arranged as shown in FIG. 1. Also, as shown in FIG. 2, used is a ROM mask 13 corresponding to the ROM data map 12 shown in FIG. 1. Incidentally, the first embodiment is applied to the case where adjacent holes 14a of the ROM mask 13 are positioned apart from each other.

Figure 3:
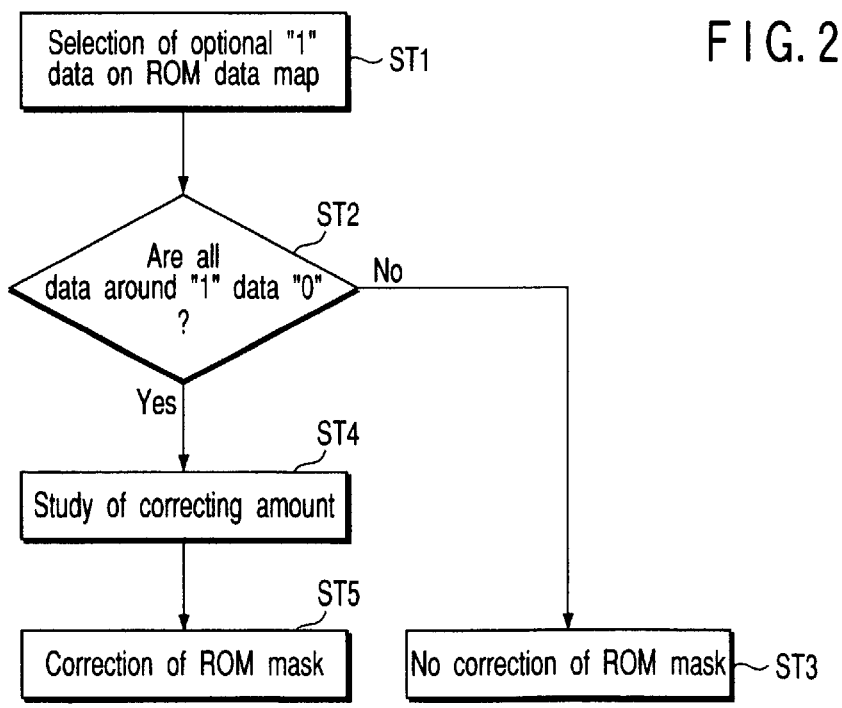
FIG. 3 is a flow chart showing the mask correcting method according to the first embodiment of the present invention.
Figure 4:
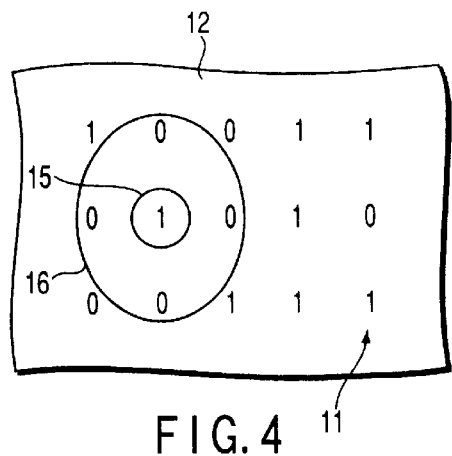
FIG. 4 shows the ROM data map according to the first embodiment of the present invention.
Figure 5:
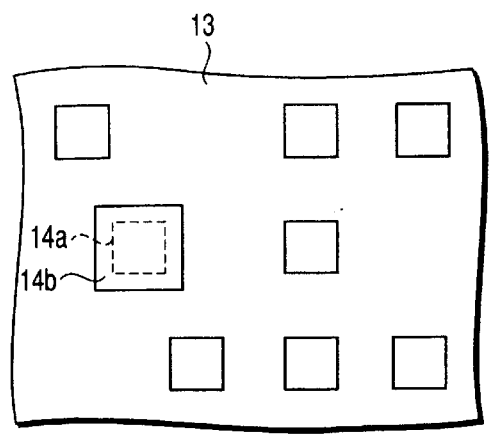
FIG. 5 shows a ROM mask after correction according to the first embodiment of the present invention.

FIG. 3 is a flow chart showing the mask correcting method according to the first embodiment of the present invention. FIG. 4 shows the ROM data map according to the first embodiment of the present invention. Further, FIG. 5 shows the ROM mask after correction according to the first embodiment of the present invention. The mask correcting method according to the first embodiment of the present invention will now be described in detail.

First of all, an optional "1" data 15 on the ROM data map 12 is selected as shown in FIG. 4 (step ST1). Then, neighboring data 16 around the optional "1" data 15 are inspected, and it is judged whether or not all the neighboring data 16 are "0", as shown in FIG. 4 (step ST2). The neighboring data 16 is defined to include, for example, four data positioned upward, downward, rightward and leftward of the optional "1", data 15.

Where it has been found that all the neighboring data 16 around the optional "1" data 15 are not "0", the ROM mask 13 is not corrected (step ST3). On the other hand, where it has been found that all the neighboring data 16 around the optional "1" data 15 are "0", it is necessary to apply a positive correction to the ROM mask 13 and, thus, the amount of correction is studied (step ST4). In the study of the correcting amount, the optimum correcting amount is obtained by the comparison with the neighboring holes that are not corrected.

In the next step, a positive correction is applied to the hole 14b of the ROM mask 13 corresponding to the optional "1" data 15 in accordance with the correcting amount noted above, as shown in FIG. 5 (step ST5) so as to manufacture the ROM mask 13.

As described above, in the ROM mask 13 to which is applied the optimum correction according to the first embodiment of the present invention, the insulated hole 14b is made larger than the neighboring hole.

According to the first embodiment of the present invention, the ROM mask 13 is prepared by applying a suitable correction at the stage of "1", "0" data, not by applying correction to the figure data after preparation of the ROM mask 13 by studying the "1", "0" pattern of the ROM data 11 providing the basis of the ROM mask 13.

To be more specific, in the computer calculation, a very troublesome processing was required for adding a correction to the figure data. However, if correction is applied in the stage of the "1", "0" data, a suitable correction can be achieved relatively simply by determining the rule of the correction. It follows that, in the manufacture of the ROM mask 13, the time for the computer processing can be shortened so as to achieve the delivery of the mask ROM in a short time.

It has been found that, when a test was applied to the actual pattern data, the method of the present invention permits shortening the time for the computer calculation to ¹⁄₁₀ or less, compared with the conventional method in which a correcting treatment is applied to the figure data.

In the first embodiment of the present invention, the range of the neighboring data 16 is defined to include four data positioned upward, downward, rightward and leftward of the optional "1" data 15. However, the neighboring data are not limited to these four data. For example, it is possible for the range of the neighboring data 16 to include 8 data positioned upward, downward, rightward, leftward, and additional obliquely positioned four data.

It is possible to change the shape of the hole to the shape differing from that of another hole in place of changing the size of the hole of the ROM mask 13 corresponding to the optional "1" data 15. In other words, it is possible to change the hole of the ROM mask 13 corresponding to the "1" data in the case where all the neighboring data are "0" to an oblong hole, with the hole of the ROM mask 13 corresponding to the ordinary "1" data being made square.

[Second Embodiment]

The first embodiment is directed to the case where the adjacent holes in the ROM mask are positioned apart from each other. However, the second embodiment is directed to the case where the adjacent holes in the ROM mask are contiguous to each other.

In the ROM mask, where the adjacent holes are contiguous to each other, the size of the hole is increased with an increase in the number of holes that are contiguous to each other. Therefore, in the second embodiment, a negative correction is applied to the holes of the ROM mask corresponding to the contiguous "1" data on the basis of the number of "1" data contiguous to each other in the ROM data map.

Figure 6:
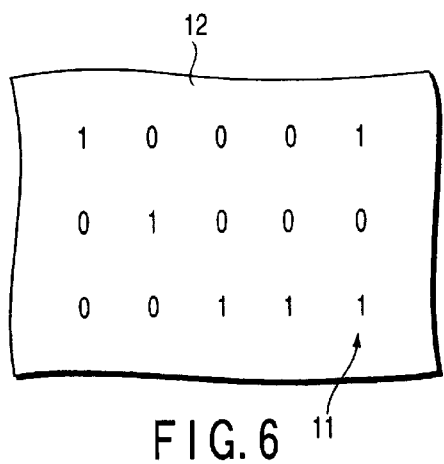
FIG. 6 shows a ROM data map according to a second embodiment of the present invention.
Figure 7:
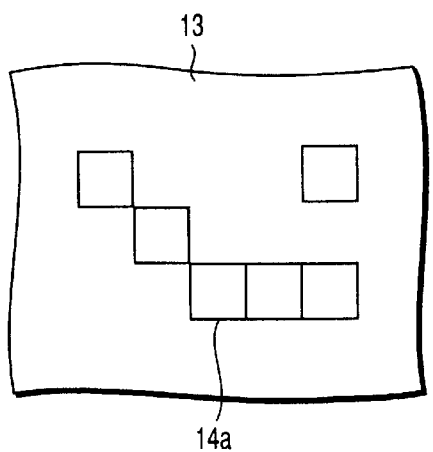
FIG. 7 shows the ROM mask before correction according to the second embodiment of the present invention.

FIG. 6 shows the ROM data map according to the second embodiment of the present invention, and FIG. 7 shows the ROM mask before correction according to the second embodiment of the present invention.

In the second embodiment, used is a ROM data map 12 in which the ROM data of "1" and "0" are irregularly arranged as shown in FIG. 6. Also, as shown in FIG. 7, used is a ROM mask 13 corresponding to the ROM data map 12 shown in FIG. 6. Incidentally, the second embodiment is applied to the case where the holes of the ROM mask 13 are joined if the "1" data on the ROM data map 12 are contiguous.

Figure 8:
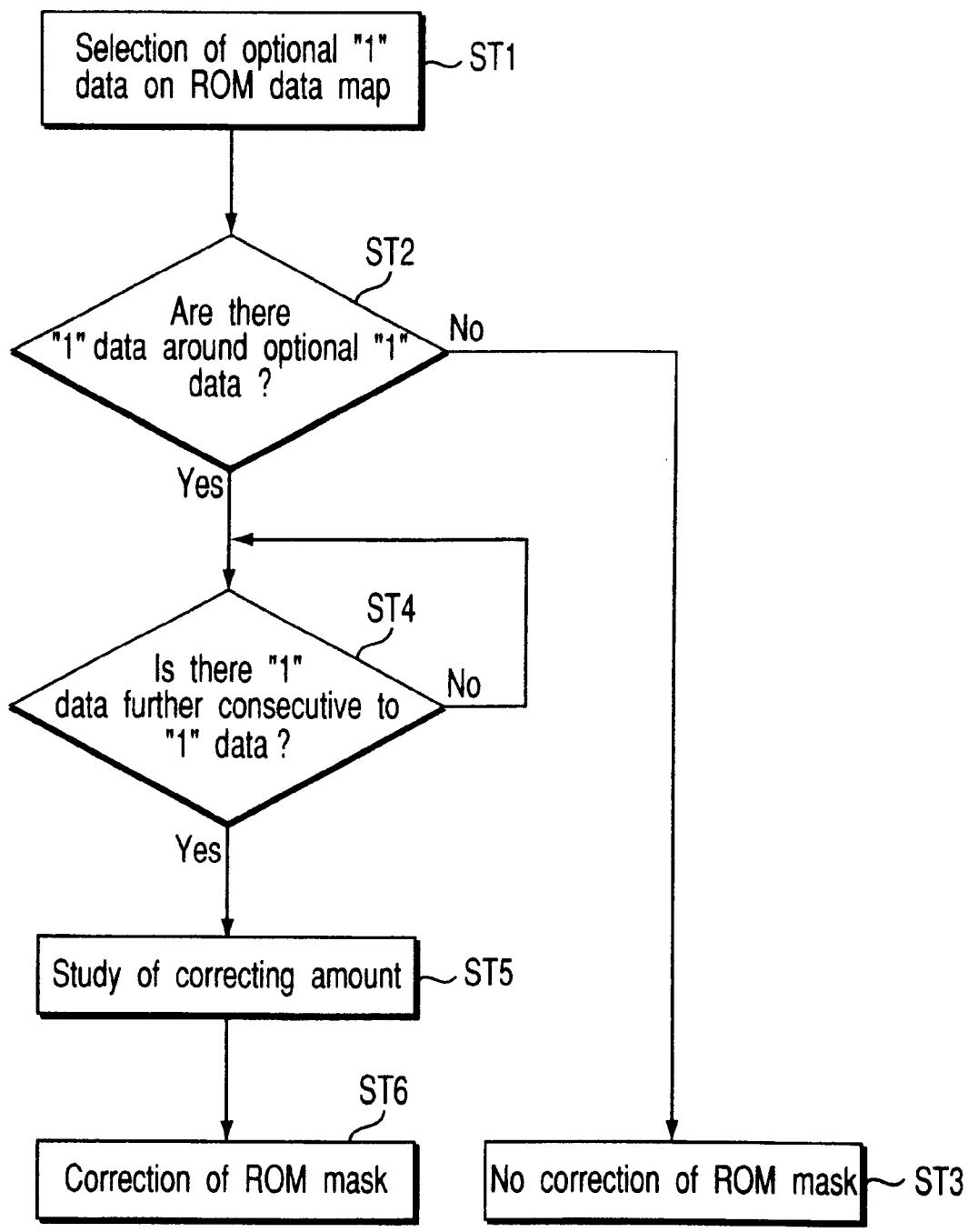
FIG. 8 is a flow chart showing the mask correcting method according to the second embodiment of the present invention.
Figure 9:
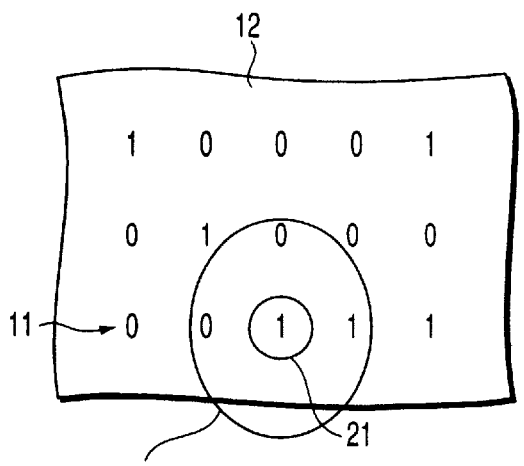
FIG. 9 shows the ROM data map according to the second embodiment of the present invention.
Figure 10:
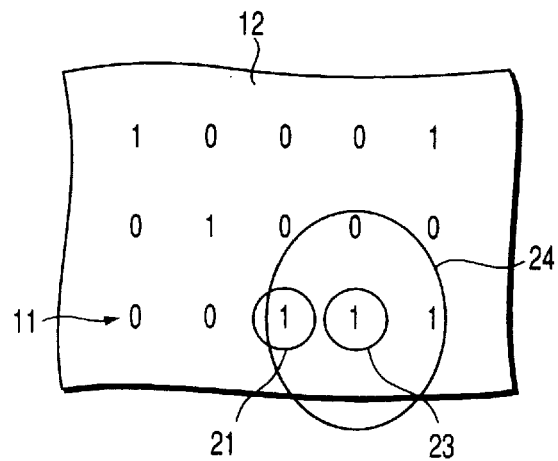
FIG. 10 shows the ROM data map according to the second embodiment of the present invention.
Figure 11:
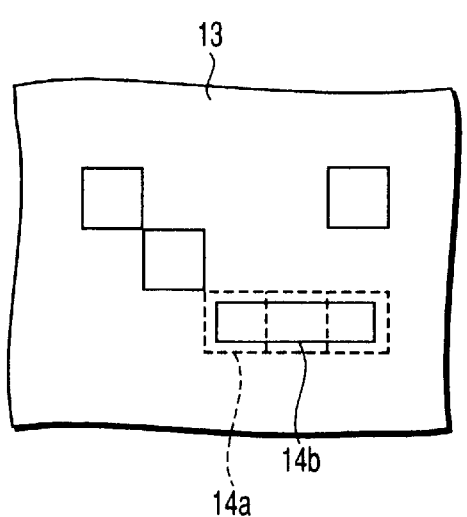
FIG. 11 shows the ROM mask after correction according to the second embodiment of the present invention.

FIG. 8 is a flow chart showing the mask correction method according to the second embodiment of the present invention. Each of FIGS. 9 and 10 shows a ROM data map according to the second embodiment of the present invention. Also, FIG. 11 shows the ROM mask after correction according to the second embodiment of the present invention. The mask correcting method according to the second embodiment of the present invention will now be described in detail.

First of all, an optional first "1" data 21 on the ROM data map 12 is selected, as shown in FIG. 9 (step ST1). Then, first neighboring data 22 around the first "1" data 21 are inspected so as to judge whether there are "1" data within the first neighboring data 22 (step ST2). In this case, the range of the neighboring data 22 is defined to include four data positioned upward, downward, rightward and leftward of the first "1" data 21. Where it has been found that "1" data is not included in the first neighboring data 22, the ROM mask 13 is not corrected (step ST3).

On the other hand, where "1" data are included in the first neighboring data 22, it is judged whether there are "1" data contiguous to a second "1" data 23, as shown in FIG. 10 (step ST4). In other words, a second neighboring data 24 of the second "1" data 23 is inspected. The second neighboring data 24 is defined to include the range of four data positioned upward, downward, rightward and leftward of, for example, the second "1" data 23.

Where "1" data is included in the second neighboring data 24, the judgment is continued until "1" data contiguous to the "1" data ceases to be present. As a result, where "1" data ceased to be included in the second neighboring data 24, the correcting amount is studied (step ST5). The study of the correcting amount is performed while making comparison with the hole that is not corrected, and an optimum correcting amount is obtained in accordance with the number of consecutive "1" data.

In the next step, a negative correction is applied to the hole of the ROM mask 13 in accordance with the correction amount so as to prepare the ROM mask 13, as shown in FIG. 11.

As described above, in the ROM mask 13 to which is applied the optimum correction in accordance with the second embodiment of the present invention, the hole comprising of a plurality of consecutive holes is made smaller than the sum of a plurality of discrete holes.

The second embodiment described above permits producing the effect similar to that produced in the first embodiment.

According to the second embodiment of the present invention described above, the range of the first neighboring data 22 includes the four data positioned upward, downward, rightward and leftward of the first "1" data 21. Likewise, the range of the second neighboring data 24 includes the four data positioned upward, downward, rightward and leftward of the first "1" data 23. However, the range of each of the first and second neighboring data 22 and 24 is not limited to the four data noted above. For example, it is possible for the range of the first neighboring data 22 to include 8 data positioned upward, downward, rightward, and leftward of the first "1" data 21, as well as obliquely positioned additional four data. Likewise, it is possible for the range of the second neighboring data 24 to include 8 data positioned upward, downward, rightward, and leftward of the first "1" data 23, as well as obliquely positioned additional four data.

[Third Embodiment]

In the ROM mask, the size of the hole is made smaller in the region having a low hole density, with the result that it is difficult to perform the ion implantation through the hole. Therefore, in the third embodiment, a positive correction is applied to the ROM data in the case where the "1" data density per unit area on the ROM data map is lower than a predetermined value.

Figure 12:
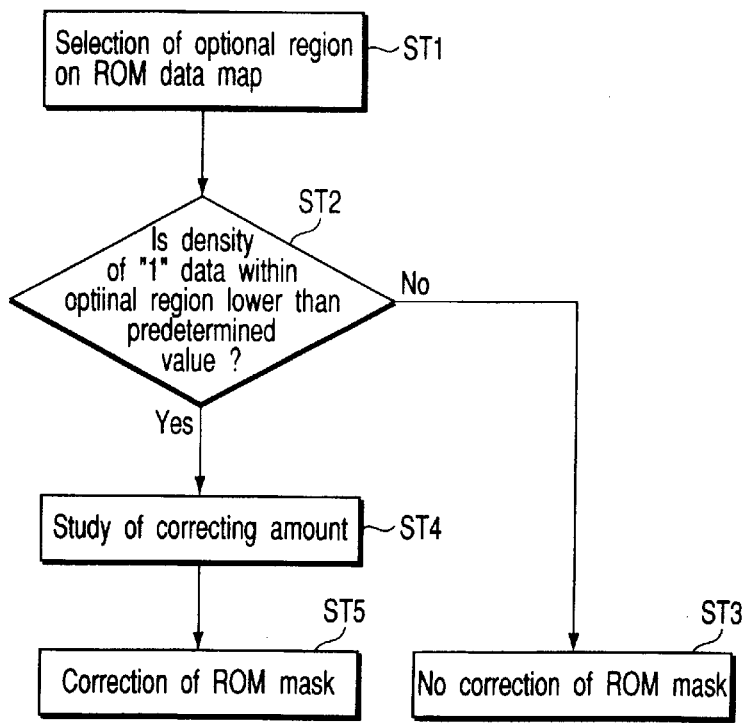
FIG. 12 is a flow chart showing a mask correcting method according to a third embodiment of the present invention.
Figure 13:
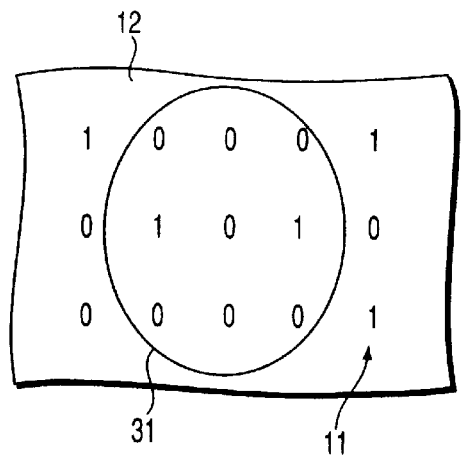
FIG. 13 shows a ROM data map according to the third embodiment of the present invention.
Figure 14:
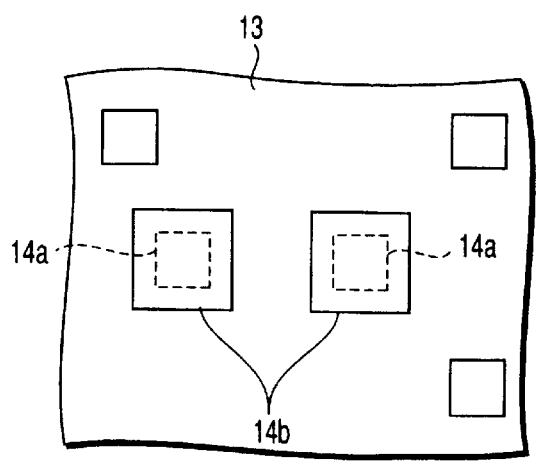
FIG. 14 shows the ROM mask after correction according to the third embodiment of the present invention.

FIG. 12 is a flow chart showing the mask correction method according to the third embodiment of the present invention. FIG. 13 shows the ROM data map according to the third embodiment of the present invention. Further, FIG. 14 shows the ROM mask after correction according to the third embodiment of the present invention. The mask correction method according to the third embodiment of the present invention will now be described in detail.

First of all, an optional region 31 is selected on the ROM data map 12, as shown in FIG. 13 (step ST1). Then, the number of "1" data present within the optional region 31 is detected so as to calculate the density of the "1" data within the optional region 31. Further, it is judged whether or not the density of the "1" data within the optional region 31 is lower than a predetermined value (step ST2). The predetermined value is set at, for example, 10%.

Where it has been found that the density of the "1" data is not lower than the predetermined value, the ROM mask 13 is not corrected (step ST3). On the other hand, where it has been found that the density of the "1" data is lower than the predetermined value, it is necessary to apply a positive correction to the ROM mask 13 and, thus, the correcting amount is studied (step ST4). The correction amount is studied by comparison with the neighboring hole that is not corrected so as to obtain an optimum correcting amount.

In the next step, a positive correction is applied to the hole 14b of the ROM mask 13 in accordance with the correcting amount, as shown in FIG. 14 (step ST5), so as to manufacture the ROM mask 13.

As described above, in the ROM mask 13 to which is applied the optimum correction according to the third embodiment of the present invention, the holes in the low density region are made larger than the holes in the high density region. Incidentally, the term "low density region" noted above denotes the region where the density of the "1" data in the optional region is not higher than the predetermined value, e.g., 10%.

The third embodiment described above permits producing the effect similar to that produced by the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a mask for a data program of a read only memory, comprising:

selecting an optional region from a data map having a plurality of first data and second data;

calculating density of the first data within the selected optional region; and when the density of the first data is lower than a predetermined value, correcting a shape of the mask at positions corresponding to all of the first data within the selected optional region.

2. The method of correcting a mask according to claim 1, wherein said mask comprises holes at positions corresponding to said first data, and when the density of the first data is lower than the predetermined value, the size of holes the corresponding to the first data within the selected optional region is larger than that of the holes corresponding to the first data outside the selected optional region.

3. The method of correcting a mask according to claim 1, wherein the predetermined value is 10%.

4. The method according to claim 1, wherein the shape of the mask in the positions corresponding to all of the first data within the selected optional region is corrected at one time.

5. A mask for a data program of a read only memory, comprising:

holes formed at positions corresponding to first data of a data map having a plurality of said first data and second data, and when the density of the first data within an optional region of the data map is lower than a predetermined value, the holes corresponding to some of the first data within the optional region are different in shape from those corresponding to the first data outside the optional region.

6. The mask according to claim 5, wherein the predetermined value is 10%.

7. The mask according to claim 5, wherein when the density of the first data within the optional region of the data map is lower than the predetermined value, the holes corresponding to all of the first data within the optional region are different in shape from those corresponding to the first data outside the optional region.

8. The mask according to claim 7, wherein the holes corresponding to the first data are larger than those corresponding to the second data.

9. The mask according to claim 5, wherein the holes corresponding to the first data are larger than those corresponding to the second data.

10. The mask according to claim 5, wherein the holes corresponding to the first data are rectangles, and the holes corresponding to the second data are squares.

11. A mask for a data program of a read only memory, comprising:

holes formed at positions corresponding to first data of a data map having a plurality of said first data and second data, said holes including:

first holes formed in a first region, and second holes formed in a second region, wherein a density of said second holes in said second region is higher than a density of said first holes in said first region, and said first holes differ in shape from said second holes.

12. The mask according to claim 11, wherein said first region is a region comprising not larger than 10% of said first data.

13. The mask according to claim 12, wherein said first holes are larger than said second holes.

14. The mask according to claim 11, wherein said first holes are larger than said second holes.

15. The mask according to claim 11, wherein the first holes are rectangles, and the second holes are squares.

16. The mask according to claim 11, wherein all the first holes in the first region are different from the second holes in the second region in shape.

* * * * *